(12) United States Patent
Pritsker

(10) Patent No.: US 9,680,493 B1
(45) Date of Patent: Jun. 13, 2017

(54) SIGNAL MONITORING SYSTEMS FOR RESOLVING NYQUIST ZONE AMBIGUITY

(71) Applicant: Altera Corporation, San Jose, CA (US)

(72) Inventor: Dan Pritsker, San Diego, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 15/271,826

(22) Filed: Sep. 21, 2016

(51) Int. Cl.
*H03M 1/12* (2006.01)
*H03M 1/06* (2006.01)

(52) U.S. Cl.
CPC ....... *H03M 1/1245* (2013.01); *H03M 1/0626* (2013.01)

(58) Field of Classification Search
CPC .. H03M 1/0614; H03M 1/0629; H03M 1/121; H03M 1/1235; H03M 1/1245; H04B 1/1036; H04B 15/06; H04B 1/0028; H04B 1/18; H04B 1/30; H04B 1/406; H04B 1/7105; H04B 7/0413; H04B 7/0802
USPC ........ 341/118, 139, 142, 155; 455/135, 132, 455/133, 137, 303–315; 375/347, 267, 375/316–346
See application file for complete search history.

(56) References Cited

U.S. PATENT DOCUMENTS

| | | | | |
|---|---|---|---|---|
| 5,198,748 A * | 3/1993 | Tsui | ....................... | G01R 23/00 324/76.21 |
| 6,026,418 A * | 2/2000 | Duncan, Jr. | ............. | G06F 17/10 324/76.21 |
| 6,031,869 A * | 2/2000 | Priebe | .................... | H03D 3/006 375/224 |
| 6,337,885 B1 * | 1/2002 | Hellberg | .................. | H04B 7/12 375/316 |
| 7,777,659 B2 * | 8/2010 | Nara | ...................... | G01R 23/16 341/143 |
| 2010/0103008 A1 * | 4/2010 | Raz | ..................... | H03M 1/0614 341/120 |
| 2010/0159866 A1 * | 6/2010 | Fudge | .................. | H04B 1/1036 455/302 |

OTHER PUBLICATIONS

U.S. Appl. No. 14/694,785, filed Apr. 23, 2015.
James Tsui, "Digital Techniques for Wideband Receivers," Electromagnetics and Radar, 3rd Edition, pp. 100-113, 2015.

* cited by examiner

*Primary Examiner* — Linh Nguyen
(74) *Attorney, Agent, or Firm* — Steven J. Cahill

(57) ABSTRACT

A signal monitoring system includes a splitter circuit, a single-bit channel circuit, a multi-bit channel circuit, and a frequency processor circuit. The splitter circuit splits a first analog signal into second and third analog signals. The single-bit channel circuit samples the second analog signal at a sampling rate that is greater than or equal to a Nyquist rate of the second analog signal to generate a first digital signal. The multi-bit channel circuit under-samples the third analog signal at a sampling rate that is less than a Nyquist rate of the third analog signal to generate second digital signals. The frequency processor circuit resolves a Nyquist zone ambiguity in the second digital signals using the first digital signal to generate an unambiguous output signal.

20 Claims, 4 Drawing Sheets ated description
and the accompanying drawings.

SIGNAL MONITORING SYSTEMS FOR RESOLVING NYQUIST ZONE AMBIGUITY

FIELD OF THE DISCLOSURE

The present disclosure relates to electronic circuits, and more particularly, to signal monitoring systems for resolving Nyquist zone ambiguity.

BACKGROUND

Electronic signal monitoring techniques are widely used in modern applications, including surveillance applications. The goal of electronic signal interception and monitoring is to detect and extract basic meta-data about a signal, which can indicate the type or classification of the transmitter.

One type of signal monitoring system divides a surveyed spectrum into slices. Each slice of the spectrum is monitored by a single multi-bit analog-to-digital converter (ADC) in a different channel. Each channel samples an un-aliased slice of the surveyed spectrum. This technique can be performed using spectrum translation of each slice to baseband with appropriate channel filtering. The disadvantage of this system is high cost, due to the requirement to implement multiple high-quality channels, with each channel having an ADC.

Another type of signal monitoring system uses under-sampling with band-pass filtering to suppress all out-of-band spectral content. However, this solution still requires multiple high-quality channels to cover a wide frequency spectrum, with each channel having an ADC.

Yet another type of signal monitoring system uses a single-bit receiver for surveillance of a wide instantaneous bandwidth. The single-bit receiver is used in a first step of detection. Once the single-bit receiver is detecting a signal of interest, the single-bit receiver provides detected signal frequency information directly to a higher-quality multi-bit receiver. The multi-bit receiver is then tuned to the signal that was first detected by the single-bit receiver. This scheme has an inherent limitation of a lag in time between the actual signal appearance and the final examination of the signal using the high-quality multi-bit receiver. Critical information in the monitored signal may be missed during the tuning time of the multi-bit receiver.

BRIEF SUMMARY

According to some embodiments, a signal monitoring system includes a splitter circuit, a single-bit channel circuit, a multi-bit channel circuit, and a frequency processor circuit. The splitter circuit splits a first analog signal into second and third analog signals. The single-bit channel circuit samples the second analog signal at a sampling rate that is greater than or equal to a Nyquist rate of the second analog signal to generate a first digital signal. The multi-bit channel circuit under-samples the third analog signal at a sampling rate that is less than a Nyquist rate of the third analog signal to generate second digital signals. The frequency processor circuit resolves a Nyquist zone ambiguity in the second digital signals using the first digital signal to generate an unambiguous output signal.

Embodiments of the present invention can be implemented in numerous ways, including as a process, an apparatus, a system, or a device. Various objects, features, and advantages of the present invention will become apparent upon consideration of the following detailed description and the accompanying drawings.

DETAILED DESCRIPTION

Figure 1:
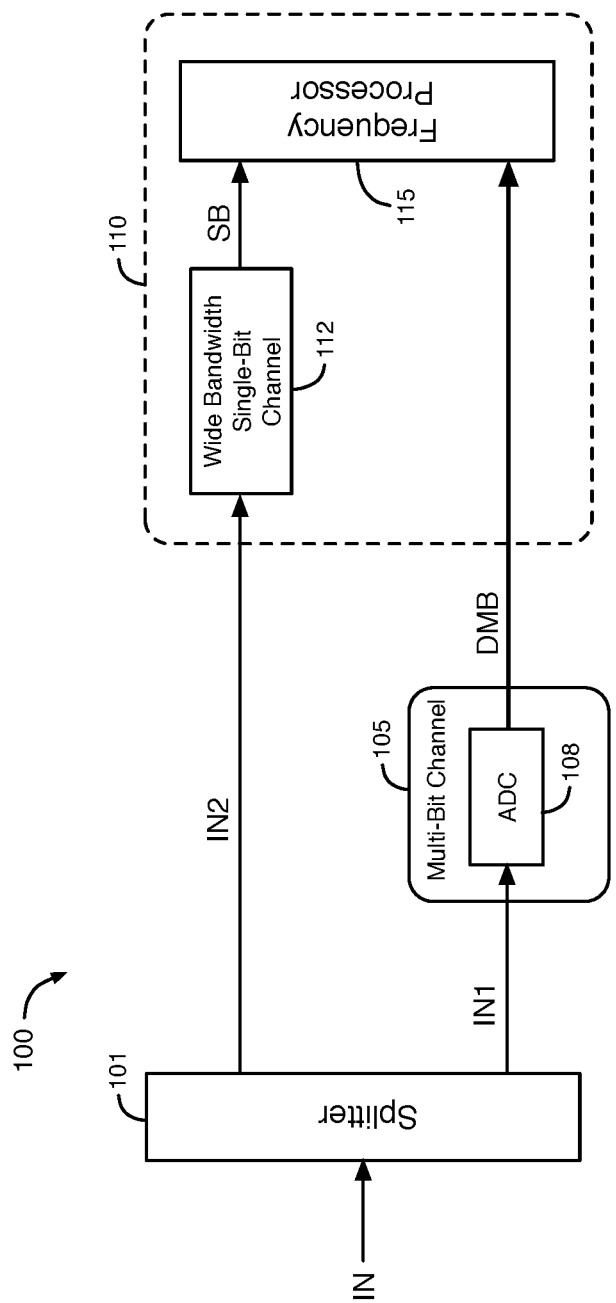
FIG. 1 illustrates an example of a signal monitoring system for resolving the Nyquist zone ambiguity in a monitored signal using a single-bit channel circuit, according to an embodiment.

The Nyquist theorem states that for a signal that is perfectly band limited to a bandwidth of B, then all of the information in that signal can be collected by sampling the signal at discrete times at a sampling rate S that is at least two times B (i.e., $S \geq 2B$). 2B is referred to as the Nyquist rate. Thus, a sampling system has to sample a signal at a sampling rate that is at least twice a maximum bandwidth of the signal in order to allow full recovery of the original signal from the sampled version of the signal.

Under-sampling is a process where a sampling system intentionally or unintentionally samples a signal having a bandwidth of B at a sampling rate that is less than 2B as required by the Nyquist theorem. Under-sampling a signal causes spectrum folding of the sampled signal to baseband. As a result of spectrum folding, the spectrum of the sampled signal cannot be completely recovered, due to the effect of aliasing. Aliasing causes the signal components to be replicated, such that the replica signals become indistinguishable aliases of one another. These replica signals are the signal's aliases. These aliases are indistinguishable from real signals, so that there is no way, once the signal is sampled, to know which parts of the sampled signal are real and which parts of the sampled signal are aliased. Thus, aliasing creates ambiguity in the sampled signal. This uncertainty is referred to herein as Nyquist zone ambiguity.

Some types of electronic signal interception systems include one or more analog-to-digital converters (ADCs) that digitize a monitored input signal to generate multi-bit digital outputs. The digital outputs of the ADCs are then processed through a fast Fourier transform operation. The extent of a monitored spectrum of interest in the input signal may be limited by the sampling rates of the ADCs, ADC availability, and the cost of the system components. On the other hand, some applications may want to reduce the sampling rate intentionally for cost reduction, power reduction, or other reasons.

A typical electronic signal interception receiver requires wide instantaneous frequency coverage to assure that no frequencies of interest are missed in a monitored input signal. Also, a reasonably good sampled signal is required in order to perform certain types of frequency processing. A multi-bit ADC typically is limited in terms of the extent of the frequency spectrum that it instantaneously monitors. On the other hand, a single-bit receiver does not provide enough signal quality for an electronic signal interception receiver.

According to some embodiments, an electronic signal monitoring system includes a signal splitter, a first channel circuit having a multi-bit analog-to-digital converter (ADC) circuit, a second channel circuit having a wide bandwidth single-bit comparator circuit, and a frequency processor circuit. The first and second channel circuits monitor an input signal concurrently. The digital output signals of the multi-bit ADC circuit and the single-bit output signal of the comparator circuit are provided to inputs of the frequency processor circuit. The frequency processor circuit resolves the Nyquist zone ambiguity in the multi-bit output signals of the ADC circuit using the single-bit output signal of the comparator circuit. The frequency processor circuit modifies the detection frequency parameters of the monitored input signal using the resolved Nyquist zone ambiguity to generate an unambiguous output signal.

FIG. 1 illustrates an example of a signal monitoring system 100 for resolving the Nyquist zone ambiguity in a monitored signal using a single-bit channel circuit, according to an embodiment. Signal monitoring system 100 includes a splitter circuit 101, a multi-bit channel circuit 105, a wide bandwidth single-bit channel circuit 112, and a frequency processor circuit 115.

In an embodiment, the single-bit channel circuit 112 and the frequency processor circuit 115 are located in a single integrated circuit (IC) 110. Single-bit channel circuit 112 may also be referred to as a mono-bit channel circuit. IC 110 may be, for example, a microprocessor IC or a programmable logic IC. Programmable logic ICs include field programmable gate arrays (FPGAs), programmable logic devices (PLDs), and programmable logic arrays (PLAs), to name a few examples. In this embodiment, splitter circuit 101 and multi-bit channel circuit 105 are in one or more other integrated circuits or discrete circuits. In an alternative embodiment, all of the circuits shown in FIG. 1 are in the same IC.

As shown in Figure (FIG. 1, a monitored analog input signal IN is provided to an input of splitter circuit 101. Splitter circuit 101 splits the analog input signal IN into two analog signals IN1 and IN2 that are provided to channels 105 and 112, respectively. Splitter circuit 101 may be, for example, a power divider circuit. Splitter circuit 101 provides the same frequency range of the input signal IN to each of the channels 105 and 112 in signals IN1 and IN2. As an example, splitter circuit 101 may provide half of the full power of signal IN and the full frequency range of signal IN to each of the channels 105 and 112 in signals IN1 and IN2, respectively. Splitter circuit 101 may, as an example, cause signals IN1 and IN2 to be duplicates of each other.

Multi-bit channel circuit 105 includes an analog-to-digital converter (ADC) circuit 108 that receives the input signal IN1 from splitter circuit 101. ADC circuit 108 converts the analog signal IN1 into multi-bit digital signals DMB. Signals DMB may have any number of two or more parallel signals. ADC circuit 108 samples the input signal IN1 at a periodic sampling rate to generate the parallel bits in signals DMB. ADC circuit 108 may, for example, sample signal IN1 in response to a periodic clock signal. The multi-bit digital signals DMB are provided in parallel from outputs of the ADC circuit 108 to inputs of frequency processor circuit 115, as shown in FIG. 1.

The sampling rate that ADC circuit 108 uses to sample signal IN1 to generate signals DMB is less than the Nyquist rate of signals IN/IN1. Therefore, ADC circuit 108 under-samples input signal IN1. Because ADC circuit 108 under-samples signal IN1, all Nyquist zones in input signal IN1 are folded to baseband in the sampled signals DMB. ADC circuit 108 samples the folded baseband zone to detect the input signal IN1 up to the Nyquist zone ambiguity. However, the output signals DMB of ADC circuit 108 are missing critical information about the actual signal frequency of signal IN1. This uncertainty is Nyquist zone ambiguity. Because of the Nyquist zone ambiguity in signals DMB, it is not possible to determine the actual Nyquist zone of input signal IN1 merely by examining the aliased band pass in signals DMB.

To resolve the Nyquist zone ambiguity, signal monitoring system 100 includes the second channel circuit 112. Channel 112 is used to resolve the ambiguity in signals DMB and to determine in which Nyquist zone signal IN is present. Channel 112 samples input signal IN2 to generate a sampled signal SB that is provided to another input of frequency processor circuit 115. Channel 112 samples the input signal IN2 at a sampling rate that is greater than (or equal to) the Nyquist rate of signals IN/IN2. Thus, channel 112 does not under-sample signal IN2. Instead, channel 112 samples input signal IN2 at a greater sampling rate than the sampling rate that ADC circuit 108 uses to sample input signal IN1. The single-bit channel 112 reduces the cost, power, and complexity of system 100, because the single-bit channel 112 uses less power and is less complex than a system having multiple ADC circuits in two or more multi-bit channels.

The detection performed by the single-bit channel 112 occurs concurrently with the detection performed by the multi-bit channel 105. In other words, channels 105 and 112 concurrently monitor input signals IN1 and IN2, respectively. Thus, each part of signal IN that is received and split by splitter circuit 101 into signals IN1 and IN2 is concurrently sampled by channels 105 and 112. Because channels 105 and 112 provide concurrent monitoring of the input signal IN, no frames of data of the input signal IN are lost. As a result, channels 105 and 112 can provide continuous surveillance of the monitored signal IN. There is no limitation on the number of signals that can be monitored by system 100, except to the extent that signals are folded to exactly the same aliasing frequency. The multi-bit channel 105 does not need to be tuned after the input signal is detected, because the multi-bit channel 105 is always detecting the input signal IN1.

In an exemplary embodiment, channel 112 includes a wide bandwidth single-bit comparator circuit that compares input signal IN2 to a threshold and a register circuit that samples the output signal of the comparator circuit to generate the single-bit output signal SB. The single-bit output signal SB is a serial stream of digital bits that is provided to frequency processor circuit 115. The unit interval of each bit in the serial signal SB is determined by the sampling rate of the register circuit.

Figure 2:
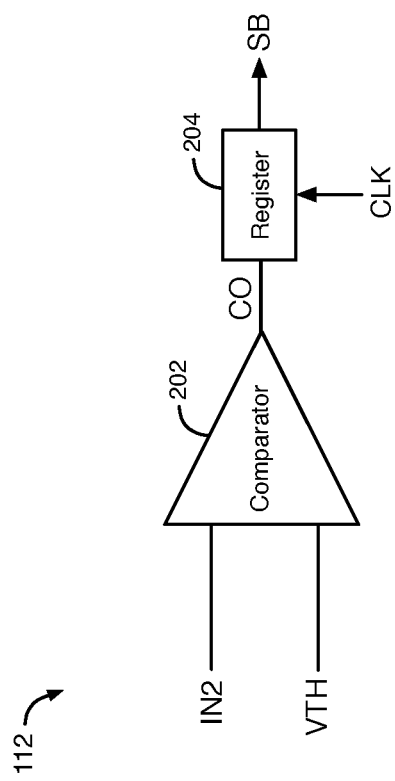
FIG. 2 illustrates an example of the wide-bandwidth single-bit channel circuit of FIG. 1, according to an embodiment.

FIG. 2 illustrates an example of the wide-bandwidth single-bit channel circuit 112 of FIG. 1, according to an embodiment. In the embodiment of FIG. 2, channel circuit 112 includes a comparator circuit 202 and a register circuit 204. In an exemplary embodiment that is not intended to be limiting, comparator circuit 202 and register circuit 204 may be implemented by a monobit receiver circuit using high-speed transceivers in an FPGA IC.

Channel 112 generates the single-bit output signal SB at its output. Channel 112 functions as an analog-to-digital converter (ADC) circuit that generates a serial stream of digital bits in a single output signal SB by comparing the input signal IN2 to a threshold voltage VTH.

Input signal IN2 from splitter 101 is provided to a first input of comparator circuit 202. A threshold voltage VTH is provided to a second input of comparator circuit 202. In response to the input signal IN2 being greater than the threshold voltage VTH, comparator circuit 202 generates a 1 bit (i.e., a logic high state) in its output signal CO. In response to the input signal IN2 being less than the threshold voltage VTH, comparator circuit 202 generates a 0 bit (i.e., a logic low state) in its output signal CO.

The output signal CO of comparator circuit 202 is provided to a data input of register circuit 204. A clock signal CLK is provided to a clock input of register circuit 204. Register circuit 204 samples the output signal CO of comparator circuit 202 to generate output signal SB at periodic intervals that are determined by clock signal CLK.

Register circuit 204 may, for example, sample signal CO once (or twice) in each period of clock signal CLK. Register circuit 204 may be level or edge sensitive. Register circuit 204 is a storage circuit that stores the logic state of the output signal CO of comparator circuit 202 as output signal SB in response to the logic state of (or rising and falling edges in) clock signal CLK. Register circuit 204 may include, for example, one or more flip-flop circuits.

Channel 112 functions as a wide bandwidth analog-to-digital converter (ADC) circuit that provides single-bit sampling of signal IN2 in response to clock signal CLK. Clock signal CLK determines the sampling rate of channel 112. The sampling rate of channel 112 is greater than or equal to the Nyquist rate of signal IN2. Specifically, the sampling rate at which register circuit 204 samples signal CO to generate serial digital bits in signal SB is greater than or equal to twice the bandwidth of signal IN2 as received at the first input of comparator circuit 202. Signal CLK also determines the unit interval of each bit generated in signal SB.

The single-bit channel 112 is used to resolve the Nyquist zone ambiguity. In this embodiment, the multi-bit channel 105 shown in FIG. 1 is used for detection, surveillance, and parameter extraction of the input signal, while the single-bit channel 112 is used solely for Nyquist zone ambiguity resolution. In order for the system 100 of FIG. 1 to have sufficient processing capability, system 100 has to generate a signal quality that is greater than a specified minimum signal quality. The ADC circuit 108 in multi-bit channel 105 generates high quality signals DMB that satisfy the system requirements for sampling quality. In contrast, the single-bit channel 112 may generate relatively poor signal quality in signal SB. Thus, the single-bit channel 112 is not used for processing and parameters extraction, but only for the purpose of ambiguity resolution. The lower quality signal sampled by the single-bit channel 112 is sufficient for resolving the Nyquist zone ambiguity, because the sampling rate of channel 112 is greater than (or equal to) the Nyquist rate of signal IN2, as stated above.

In an embodiment, channel 112 can achieve a very high sampling rate for signal SB. However, because the output signal SB of the circuitry of FIG. 2 is just a single bit, the dynamic range and signal-to-noise ratio (SNR) are limited. SNR can be improved by applying a post-processing fast Fourier transform to effectively lower a noise floor. In addition, there are abundant spurs in the sampled signal SB that are caused by single bit sampling. The spurs can be reduced by different dithering techniques, including for example, the dithering technique disclosed in commonly-assigned U.S. patent application Ser. No. 14/694,785, filed Apr. 23, 2015, which is incorporated by reference herein in its entirety, to create integrated digital dithering.

In some embodiments, the detected signals DMB from multi-bit channel 105 can assist frequency processor circuit 115 in detecting the signal generated by the single-bit channel 112 by utilizing a correlation between the two paths in the two channels 105 and 112. Further details of functions that can be performed by the frequency processor circuit 115 in system 100 are described below with respect to FIG. 3.

Figure 3:
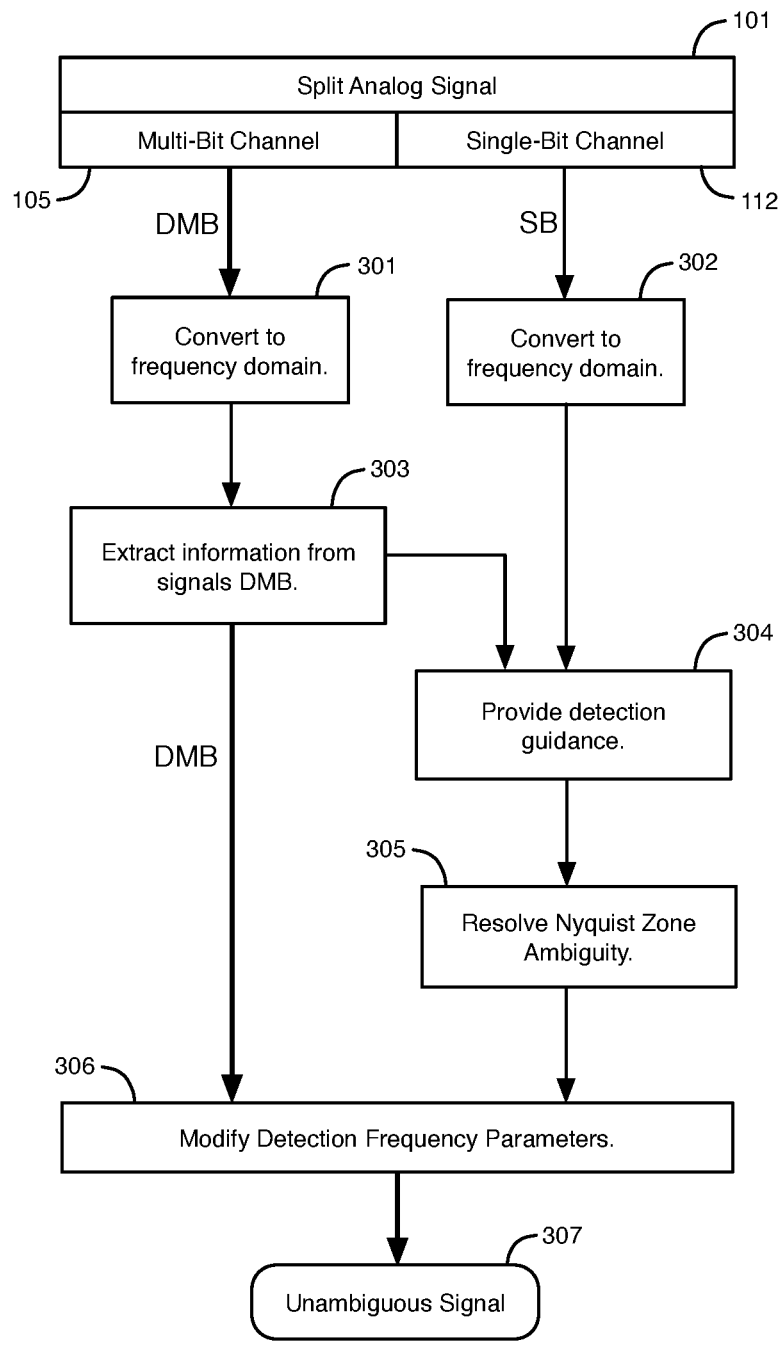
FIG. 3 is a flow chart that illustrates examples of operations that can be performed by the frequency processor circuit of FIG. 1 to resolve the Nyquist zone ambiguity and to generate an unambiguous output signal, according to an embodiment.

FIG. 3 is a flow chart that illustrates examples of operations that can be performed by the frequency processor circuit 115 to resolve the Nyquist zone ambiguity and to generate an unambiguous output signal, according to an embodiment. As discussed above, splitter circuit 101 splits an input analog signal IN into two signals IN1 and IN2 that are provided to two channels 105 and 112, respectively. The output signals DMB and SB of channels 105 and 112 are provided to inputs of frequency processor circuit 115, as shown in FIG. 1.

Operations 301-306 shown in FIG. 3 are performed by frequency processor circuit 115 in the embodiment of FIG. 1. Frequency processor circuit 115 performs Fourier transforms to convert signals DMB and signal SB from the time domain to the frequency domain. Frequency processor circuit 115 performs the Fourier transforms on signals DMB and SB in operations 301 and 302, respectively. In operation 303, frequency processor circuit 115 extracts information from the output signals DMB of the multi-bit channel 105 to help resolve the Nyquist zone ambiguity in signals DMB. The information extracted from signals DMB may, for example, include potential frequencies or ranges of frequencies where the input signal IN/IN1 is located. The information extracted from signals DMB is provided as detection guidance for the single-bit signal SB in operation 304. The frequency processor circuit 115 may utilize a correlation between the two paths in the two channels 105 and 112 using signal SB and the detection guidance generated in operations 303-304.

In operation 305, the frequency processor circuit 115 resolves the Nyquist zone ambiguity in the detected signal using signal SB and using the detection guidance information extracted from signals DMB. Because the single-bit channel 112 is a wide-band channel that samples signal IN2 at a sampling rate that is greater than (or equal to) the Nyquist rate of signal IN2, the output signal SB of channel 112 does not have aliasing. Thus, the frequencies of signal SB indicate the true frequencies of input signal IN. Therefore, frequency processor circuit 115 can determine the true frequencies of input signal IN using the un-aliased output signal SB of the single-bit channel 112. The true frequencies of the input signal IN as indicated by signal SB are then used to resolve the uncertainty in the output signals DMB of the multi-bit channel 105.

In operation 306, the frequency processor circuit 115 modifies the detection frequency parameters of the signals DMB using the resolved Nyquist zone ambiguity determined in operation 305. The samples of the DMB signals are unmodified. In operation 306, the frequency processor circuit 115 resolves the correct frequency and modifies metadata at which the true frequency of the signal was detected to generate an unambiguous output signal 307.

Figure 4:
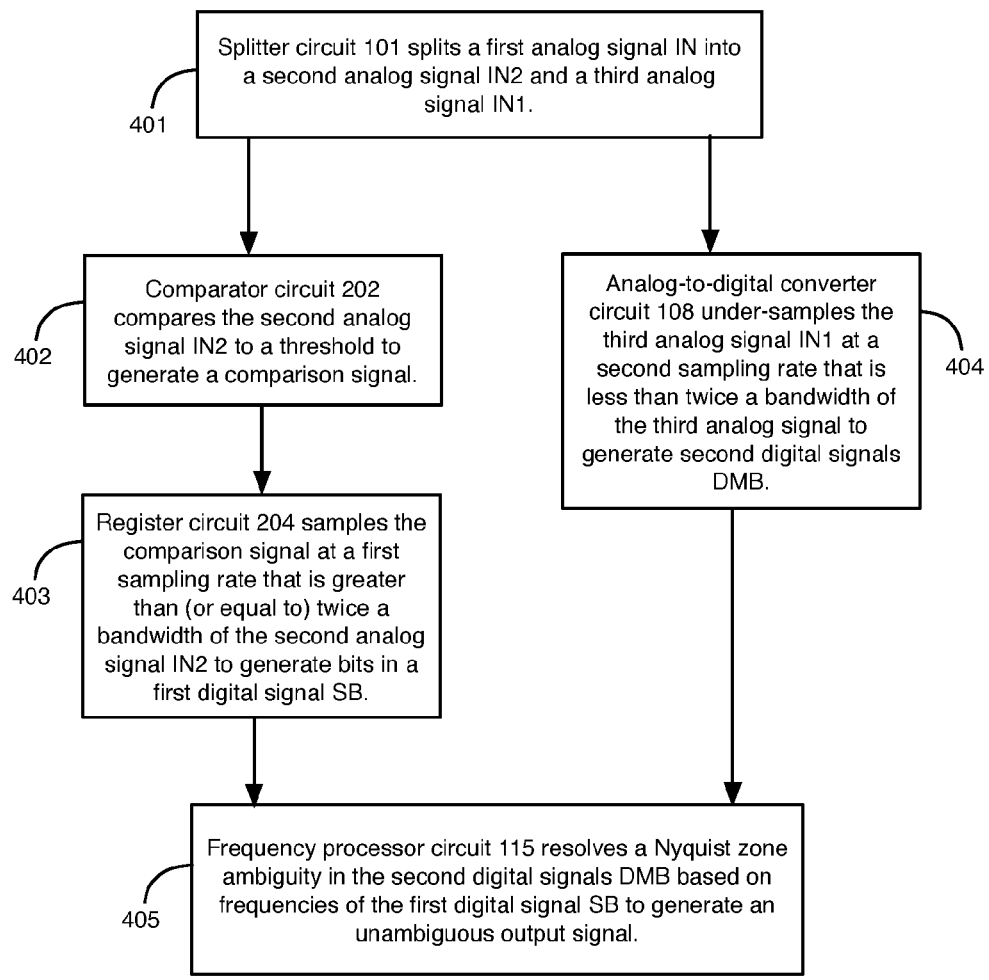
FIG. 4 is a flow chart that illustrates examples of operations that may be performed to monitor an analog input signal, according to an embodiment.

FIG. 4 is a flow chart that illustrates examples of operations that may be performed to monitor an analog input signal, according to an embodiment. In operation 401, splitter circuit 101 splits a first analog signal IN into a second analog signal IN2 and a third analog signal IN1. In operation 402, comparator circuit 202 compares the second analog signal IN2 to a threshold to generate a comparison signal CO. In operation 403, register circuit 204 samples the comparison signal at a first sampling rate that is greater than (or equal to) twice a bandwidth of the second analog signal to generate bits in a first digital signal SB. In operation 404, analog-to-digital converter circuit 108 under-samples the third analog signal IN1 at a second sampling rate that is less than twice a bandwidth of the third analog signal IN1 to generate second digital signals DMB. Operations 402-403 may occur concurrently with operation 404, such that channel circuit 105 and channel circuit 112 concurrently monitor corresponding portions of the second and third analog signals. In operation 405, frequency processor circuit 115 resolves a Nyquist zone ambiguity in the second digital signals DMB based on frequencies of the first digital signal SB to generate an unambiguous output signal.

The methods and apparatuses disclosed herein may be incorporated into any suitable electronic device or system of electronic devices. The methods and apparatuses may be used in numerous types of integrated circuits, such as programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), digital signal processors (DSPs), microprocessors, and graphics processing units (GPUs).

The signal monitoring systems disclosed herein may be part of a data processing system that includes one or more of the following components; a processor; memory; input/output circuitry; and peripheral devices. The signal monitoring systems can be used in a wide variety of applications, such as computer networking, data networking, instrumentation, video processing, digital signal processing, or any other application.

Although the method operations were described in a specific order, it should be understood that other operations may be performed in between described operations, described operations may be adjusted so that they occur at different times or in a different order, or described operations may be distributed in a system that allows the occurrence of the processing operations at various intervals associated with the processing.

The foregoing description of the exemplary embodiments of the present invention has been presented for the purpose of illustration. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A signal monitoring system comprising:
   a splitter circuit that splits a first analog signal into second and third analog signals;
   a first channel circuit comprising a comparator circuit that compares the second analog signal to a threshold to generate a comparison signal, wherein the first channel circuit samples the comparison signal at a first sampling rate that is greater than or equal to twice a bandwidth of the second analog signal to generate bits in a first digital signal;
   a second channel circuit comprising an analog-to-digital converter circuit that under-samples the third analog signal at a second sampling rate that is less than twice a bandwidth of the third analog signal to generate second digital signals; and
   a frequency processor circuit that resolves a Nyquist zone ambiguity in the second digital signals using the first digital signal to generate an unambiguous output signal.

2. The signal monitoring system of claim 1, wherein the splitter circuit provides a same frequency range of the first analog signal to each of the first and second channel circuits in the second and third analog signals.

3. The signal monitoring system of claim 1, wherein the first channel circuit further comprises a register circuit that samples the comparison signal in intervals of time that are determined by a clock signal to generate serial bits in the first digital signal.

4. The signal monitoring system of claim 1, wherein the analog-to-digital converter circuit generates the second digital signals as a set of parallel digital bits that are provided in parallel to inputs of the frequency processor circuit.

5. The signal monitoring system of claim 1, wherein the unambiguous output signal is a representation of the first analog signal.

6. The signal monitoring system of claim 1, wherein the first channel circuit and the second channel circuit concurrently monitor corresponding portions of the second and third analog signals.

7. The signal monitoring system of claim 1, wherein the only channels in the signal monitoring system that monitor the first analog signal to generate the unambiguous output signal are the first and second channel circuits.

8. The signal monitoring system of claim 1, wherein the first channel circuit and the frequency processor circuit are in a transceiver in a field programmable gate array integrated circuit.

9. A circuit system comprising:
   a comparator circuit that compares a first analog signal to a threshold to generate a comparison signal;
   a storage circuit that samples the comparison signal at a first sampling rate that is greater than or equal to a Nyquist rate of the first analog signal to generate serial bits in a first digital signal;
   an analog-to-digital converter circuit that under-samples a second analog signal at a second sampling rate that is less than a Nyquist rate of the second analog signal to generate second digital signals; and
   a frequency processor circuit that resolves a Nyquist zone ambiguity in the second digital signals using the first digital signal to generate an unambiguous output signal.

10. The circuit system of claim 9 further comprising:
    a splitter circuit that splits a third analog signal into the first and second analog signals.

11. The circuit system of claim 10, wherein the unambiguous output signal is a representation of the third analog signal.

12. The circuit system of claim 9, wherein the analog-to-digital converter circuit generates the second digital signals as a set of parallel digital bits that are provided in parallel to inputs of the frequency processor circuit.

13. The circuit system of claim 9, wherein the storage circuit samples the comparison signal in intervals of time that are determined by a periodic clock signal to generate the serial bits in the first digital signal.

14. The circuit system of claim 9, wherein the comparator circuit and the analog-to-digital converter circuit concurrently monitor corresponding portions of the first and second analog signals.

15. The circuit system of claim 9, wherein the comparator circuit, the storage circuit, and the frequency processor circuit are in a receiver circuit in a field programmable gate array integrated circuit.

16. A method comprising:
splitting a first analog signal into second and third analog signals using a splitter circuit;
comparing the second analog signal to a threshold to generate a comparison signal using a comparator circuit;
sampling the comparison signal at a first sampling rate that is greater than or equal to twice a bandwidth of the second analog signal to generate serial bits in a first digital signal;
under-sampling the third analog signal using an analog-to-digital converter circuit at a second sampling rate that is less than twice a bandwidth of the third analog signal to generate second digital signals; and
resolving a Nyquist zone ambiguity in the second digital signals based on frequencies of the first digital signal to generate an unambiguous output signal using a frequency processor circuit.

17. The method of claim 16, wherein the unambiguous output signal is a representation of the first analog signal.

18. The method of claim 16, wherein sampling the comparison signal further comprises sampling the comparison signal using a register circuit in intervals of time that are determined by a clock signal to generate the serial bits in the first digital signal.

19. The method of claim 18, wherein the comparator circuit and the register circuit are in a first channel circuit in a signal monitoring system, wherein the analog-to-digital converter circuit is in a second channel circuit in the signal monitoring system, and wherein the first channel circuit and the second channel circuit concurrently monitor corresponding portions of the second and third analog signals.

20. The method of claim 16, wherein under-sampling the third analog signal using the analog-to-digital converter circuit to generate the second digital signals further comprises generating the second digital signals as a set of parallel digital bits that are provided in parallel to inputs of the frequency processor circuit.

\* \* \* \* \*